United States Patent [19]

Freeman et al.

[11] Patent Number: 4,863,561
[45] Date of Patent: Sep. 5, 1989

[54] METHOD AND APPARATUS FOR CLEANING INTEGRATED CIRCUIT WAFERS

[75] Inventors: Dean W. Freeman, Garland; Cecil J. Davis, Greenville, both of Tex.

[73] Assignee: Texas Instruments Incorporated, Dallas, Tex.

[21] Appl. No.: 251,043

[22] Filed: Sep. 26, 1988

Related U.S. Application Data

[63] Continuation of Ser. No. 939,655, Dec. 9, 1986, abandoned.

[51] Int. Cl.⁴ ............ H01L 21/306; B44C 1/22; C03C 15/00; C03C 25/06
[52] U.S. Cl. .................................. 156/646; 134/1; 134/102; 156/643; 156/662; 156/345; 204/192.32; 204/298
[58] Field of Search ............ 156/643, 646, 656, 662, 156/345; 204/192.32, 298; 134/1, 102

[56] References Cited

U.S. PATENT DOCUMENTS

| | | | |
|---|---|---|---|
| 4,123,316 | 10/1978 | Tsuchimoto | 156/646 X |
| 4,192,706 | 3/1980 | Horiike | 156/646 X |
| 4,615,756 | 10/1986 | Tsujii et al. | 156/345 |
| 4,643,799 | 2/1987 | Tsujii et al. | 156/635 |
| 4,664,747 | 5/1987 | Sekiguchi et al. | 156/643 |
| 4,689,112 | 8/1987 | Bersin | 156/643 |

*Primary Examiner*—William A. Powell
*Attorney, Agent, or Firm*—Joseph E. Rogers; Thomas W. DeMond; Melvin Sharp

[57] ABSTRACT

The described embodiment of the present invention provides a method and device for cleaning the surface of a silicon wafer using dry gases. At least one of the gases provided is excited by passing the gas through a microwave plasma generator or by heating the wafer thereby exciting the gases near the surface of the wafer. The excitation of the gases causes chemical reactions similar to those induced by ionization of the nongaseous cleaning materials in water. After a suitable etching period, the etching chamber is purged using an insert gas, such as nitrogen, which helps carry away the remaining reacted contaminants.

14 Claims, 1 Drawing Sheet

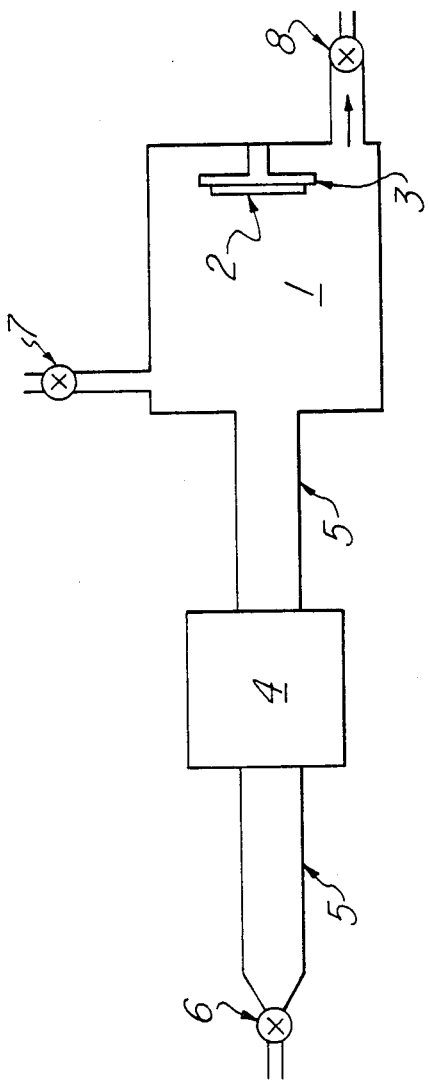

METHOD AND APPARATUS FOR CLEANING INTEGRATED CIRCUIT WAFERS

This application is a continuation of application Ser. No. 06/939,655, filed 12/09/86, now abandoned.

FIELD OF THE INVENTION

The present invention relates to the field of integrated circuit technology. More specifically, the present invention relates to the area of removing contaminants from the surface of an integrated circuit wafer intermediate to processing steps for fabricating integrated circuits in that wafer.

BACKGROUND OF THE INVENTION

Before most processing steps can be performed in the fabrication of integrated circuits in a semiconductor wafer, it is essential that the surface of the wafer be as clean as possible. Several materials can cause irreparable damage to the integrated circuits if allowed to remain on the surface of the wafer. Among these are organic materials and metals such as sodium, manganese, cobalt, nickel, copper, molybdenum, and gold. Wet or "dip" cleaning is a common technique used to remove these materials, as well as possible. Several chemicals have been proposed for use in wet cleaning and utlrasonic cleansers have been used to enhance the cleaning effect. See Kern, "Purifying Si and SiO2 Surfaces With Hydrogen Peroxide", Semiconductor International, April 1984, page 94–99, which is hereby incorporated by reference. However, wet cleaning has substantial problems. Among these, the use of water often provides a physical binding effect of the contaminants to the surface of the wafer. In addition, the combined effect of the aqueous contaminants with the oxidizing effect of the water forms a native oxide on the surface of the wafer (assuming a silicon wafer) which may grow around the contaminants. Also, the use of water on the surface of the wafer itself is thought to cause pitting and delamination problems in processing subsequent steps. These are thought to be caused by minute traces of water left on the surface of the wafer even after drying. Presently available water purifying techniques are not completely effective, particularly with regard to sodium. Thus the cleansing process may add contaminants. In addition, the water that is not immediately washed away will contain contaminants which may find their way back to the surface of the wafer. Also, the liquids used in cleaning are toxic and thus difficult and expensive to dispose.

SUMMARY OF THE INVENTION

The described embodiment of the present invention provides a method and device for cleaning the surface of a silicon wafer using dry gases. At least one of the gases provided is excited by passing the gas through a microwave plasma generator or by heating the wafer thereby exciting the gases near the surface of the wafer. The excitation of the gases causes chemical reactions similar to those induced by ionization of the nongaseous cleaning materials in water. After a suitable etching period, the etching chamber is purged using an inert gas, such as nitrogen, which helps carry away the remaining reacted contaminants.

BRIEF DESCRIPTION OF THE DRAWING

FIG. 1 is a block schematic diagram depicting one embodiment of the invention which is used in a method for cleaning a semiconductor wafer in gaseous format, which is another embodiment of the present invention.

DETAILED DESCRIPTION

FIG. 1 is a block schematic diagram of mechanism which is one embodiment of the present invention, used to dry clean the surface of a semiconductor wafer. This method is another embodiment of the present invention. Block schematic diagram FIG. 1 shows one embodiment of the present invention. Chamber 1 is used to house semiconductor wafer 2 during dry cleaning. Semiconductor wafer 2 is mounted on chuck 3. The following discussion will assume that semiconductor wafer 2 is a silicon semiconductor wafer. Of course, the present invention may be used to clean the surface of other semiconductor wafers, such as gallium arsenide or indium phosphide, using chemicals appropriate for cleaning the surfaces of those semiconductors. Chamber 1 has two sources of gases controlled by valves 6 and 7. Valve 6 feeds a quartz tube 5 which passes through a microwave plasma generator 4. The gases in chamber 1 may be drawn out through valve 8. Wafer 2 may be cleaned using a single gas provided through valve 6 and excited by plasma generator 4 or the plasma excited gas may be mixed with gases entering valve 7 in chamber 1. Several gases have been experimentally determined to provide adequate results. Among these are hydrofluoric acid, hydrochloric acid, hydrobromic acid, oxygen, and combinations of these. Of course, other gases may provide adequate results and are considered within the scope of the present invention. The process described here uses oxygen and hyrdrochloric acid in combination as an example. Oxygen is introduced through valve 6 into quartz tube 5. The oxygen passes through microwave plasma generator 4 which excites the oxygen into a plasma state. After the oxygen leaves plasma generator 4, the oxygen gas quickly reassociates from the plasma state into oxygen molecules. However, a large proportion of oxygen atoms will remain excited to induce chemical reaction. Hydrochloric acid gas is introduced by a valve 7 into chamber 1 the mixture of hydrochloric gas and excited oxygen gas also creates ionic hydrogen and chlorine. These excited gases are introduced to the surface of wafer 2 which causes reaction with the materials on the surface of wafer 2. For example, gold on the surface of wafer 2 will combine with four chlorine atoms to provide AUCL4. This compound precipitates away from the surface of wafer 2 and is carried out through valve 8. After a suitable time for reaction of the contaminant materials on the surface of wafer 2, nitrogen is introduced through valve 7 and valve 6, and plasma generator 4 is shut off. The appropriate time necessary for maximum reaction of contaminate materials on wafer 2 with the cleaning gases is highly dependent upon the components of the cleaning mechanism shown in FIG. 1. Variables such as the size of quartz tube 5, the energy capacity of microwave plasma generator 4 and the gas pumping capacities play a part in the amount of time necessary for proper cleaning. The nitrogen is used to completely purge the chamber and is withdrawn through valve 8.

Experiments were conducted using various gases and a control group cleaned using a Megasonic wet cleaning system. An MTI Afterglow Asher was modified for gas cleaning. The temperature of the chuck 3 was 300 degrees C. The pressure in chamber 1 was 3 torr. Approximately 2.5 watts of RF energy was applied to the plasma generator 4. Hydrochloric, hydrobromic and hydroflouric acids in gaseous form were use in various combinations with themselves and oxygen. The results of the experiments are summarized in table I. The data are in atoms/cm$^3$. As can be seen the cleaning effectiveness of the experimental procedures compares favorably with the ultrasonic wet cleaning process.

TABLE I

| ELEMENT | HCl plasma | HCl plasma | HCl no plasma | HCl no plasma | HCl/O$_2$ plasma | HCl/O$_2$ no plasma |
|---|---|---|---|---|---|---|
| Na | $4.9 \times 10^{16}$ | $3.7 \times 10^{15}$ | $1.1 \times 10^{16}$ | $4.3 \times 10^{15}$ | $7.5 \times 10^{15}$ | $6.1 \times 10^{15}$ |
| Mn | $2.3 \times 10^{16}$ | $8.9 \times 10^{15}$ | $4.7 \times 10^{15}$ | $3.4 \times 10^{15}$ | $9.1 \times 10^{14}$ | $1.2 \times 10^{15}$ |
| Co | $9.3 \times 10^{16}$ | $3.3 \times 10^{16}$ | $3.3 \times 10^{16}$ | $3.9 \times 10^{16}$ | $6.5 \times 10^{15}$ | $7.2 \times 10^{15}$ |
| Ni | * | * | * | * | * | * |
| Cu | $6.0 \times 10^{15}$ | $3.0 \times 10^{15}$ | $1.5 \times 10^{15}$ | $4.6 \times 10^{14}$ | $1.6 \times 10^{15}$ | $3.7 \times 10^{14}$ |
| Mo | * | * | $1.1 \times 10^{16}$ | $9.3 \times 10^{15}$ | * | $9.9 \times 10^{15}$ |
| Au | $2.4 \times 10^{15}$ | $6.0 \times 10^{14}$ | $2.0 \times 10^{15}$ | $8.0 \times 10^{12}$ | $7.0 \times 10^{12}$ | $8.0 \times 10^{12}$ |

| ELEMENT | HCL/HBr plasma | HCL/HBr no plasma | HBr/O$_2$ plasma | HBr/O$_2$ no plasma | control mega/nitric |
|---|---|---|---|---|---|
| Na | $4.7 \times 10^{15}$ | $9.1 \times 10^{15}$ | $3.4 \times 10^{15}$ | $1.6 \times 10^{16}$ | $4.4 \times 10^{15}$ |
| Mn | $6.9 \times 10^{15}$ | $4.2 \times 10^{15}$ | $7.4 \times 10^{14}$* | $8.6 \times 10^{14}$ | $1.1 \times 10^{14}$* |
| Co | $9.1 \times 10^{16}$ | $3.1 \times 10^{16}$ | $3.9 \times 10^{16}$ | $8.2 \times 10^{15}$ | $1.8 \times 10^{15}$* |
| Ni | $8.8 \times 10^{18}$* | $1.9 \times 10^{19}$ | * | * | * |
| Cu | $2.0 \times 10^{15}$ | $1.1 \times 10^{15}$ | $3.0 \times 10^{15}$ | $5.7 \times 10^{14}$ | $7.6 \times 10^{13}$ |
| Mo | * | $5.0 \times 10^{15}$ | $4.9 \times 10^{15}$* | $7.6 \times 10^{15}$ | $1.0 \times 10^{15}$* |
| Au | $6.0 \times 10^{12}$ | $7.0 \times 10^{12}$ | $1.5 \times 10^{14}$ | $2.0 \times 10^{14}$ | $2.4 \times 10^{13}$ |

*indicates a measurement below or near the limits of the counter

Another method for generating excited atoms and thus reacting with contaminants on the surface of wafer 2 is heating chuck 3 which causes heating of wafer 2. At a sufficient temperature, approximately 150 to 200 degrees C., chemical reaction will take place between the cleaning gases and the contaminant material on the surface of wafer 2. This temperature will not cause appreciable alteration of the semiconductor structures in the wafer nor will it generate ionic species which may implant into the wafer. This method provides a similar cleaning effect to that of the plasma generated excitation method described above. Other methods of inducing the chemical reaction between the gases and the contaminant materials may be used. For example, passing a laser beam parallel to and near the surface of the wafer will cause excitation and heating. However, care must be used to avoid generating high energy ions near the surface of the wafer.

TECHNICAL ADVANTAGES

The present invention provides a method for cleaning the surface of semiconductor wafers using dry gases. Prior art methods used wet materials to clean the surface of the semiconductor wafer. The use of wet chemicals causes changes in the surface of the semiconductor wafer which may impede proper cleaning. In addition, minute traces of moisture may remain after cleaning which causes delamination and pitting problems during subsequent processing steps. These problems are avoided by the present invention. In addition, because the use of liquid cleaning solutions is avoided, the present invention may easily be incorporated into a vacuum processing system and may be easily incorporated with a machine using vacuum processing or gas processing systems. Incorporating these systems avoids contact with the open air and human contact, both of which introduce particulate contamination.

We claim:

1. A method for treating a semiconductor wafer comprising the steps of:
   providing said semiconductor wafer;
   exciting a cleaning gas to a non-plasma state; and
   flowing said cleaning gas over said wafer.
2. The method of claim 1 wherein said cleaning gas is excited in a chamber remote from said semiconductor wafer.
3. A method for treating a semiconductor wafer comprising the steps of:
   providing said semiconductor wafer in a cleaning chamber;
   exciting a cleansing gas in excitation chamber; and
   introducing said excited cleansing gas into said cleaning chamber to a non-plasma state.
4. The method of claim 3 wherein an unexcited cleansing gas is also introduced into said cleansing chamber.
5. The method of claim 3 wherein said excited cleansing gas is excited in a plasma generator followed by reassociation.
6. A method for treating a semiconductor wafer comprising the steps of:
   providing said semiconductor wafer on a chuck in a cleaning chamber;
   introducing a first cleansing gas into said cleaning chamber; and
   heating said chuck to excite said cleansing gas to react with contaminants on the surface of said semiconductor wafer.
7. The method of claim 6 wherein an unexcited cleansing gas is also introduced into said cleaning chamber.
8. An apparatus for treating a semiconductor wafer comprising:
   (a) a cleaning chamber;
   (b) an excitation chamber having an outlet into said cleaning chamber;
   (c) a first valve controlling a source of cleaning gas into said excitation chamber;
   (d) means for exciting gases in said excitation chamber;
   (e) a second valve controlling an outlet from said cleaning chamber;
   (f) a third valve controlling a source of gas into said cleaning chamber;
   (g) a source of purge gas connected to said chamber; and (h) a chuck for holding said semiconductor wafer in said cleaning chamber.

9. The structure of claim 1 wherein said means for exciting said gases is a plasma generator.

10. The structure of claim 9 wherein said plasma generator is a microwave plasma generator.

11. An apparatus for treating a semiconductor wafer comprising:
(a) a cleaning chamber;
(b) a first valve controlling a source of cleaning gas into said excitation chamber;
(c) a second valve controlling an outlet from said cleaning chamber;
(d) a third valve controlling a source of gas into said cleaning chamber;
(e) a source of purge gas connected to said chamber; and
(f) a chuck for holding said semiconductor wafer in said cleaning chamber, said chuck including a heating element.

12. The structure of claim 11 wherein said heating element is a resistance heating element.

13. The method of claim 6 wherein the chuck is heated to approximately 150°–200° C.

14. The apparatus of claim 12 wherein the heating element is capable of heating the wafer to approximately 150°–200° C.

* * * * *